(12) United States Patent
Murugan et al.

(10) Patent No.: US 7,919,860 B2
(45) Date of Patent: Apr. 5, 2011

(54) SEMICONDUCTOR DEVICE HAVING WAFER LEVEL CHIP SCALE PACKAGING SUBSTRATE DECOUPLING

(75) Inventors: Rajen M. Murugan, Garland, TX (US);
Robert F. McCarthy, Dallas, TX (US);
Baher S. Haroun, Allen, TX (US);
Peter R. Harper, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 415 days.

(21) Appl. No.: 12/048,294

(22) Filed: Mar. 14, 2008

(65) Prior Publication Data

US 2009/0057889 A1 Mar. 5, 2009

Related U.S. Application Data

(60) Provisional application No. 60/968,098, filed on Aug. 27, 2007.

(51) Int. Cl.
*H01L 23/48* (2006.01)

(52) U.S. Cl. ......... 257/737; 257/E23.021; 257/E21.536; 438/393; 438/613

(58) Field of Classification Search .................. 257/737, 257/E23.021, E21.536
See application file for complete search history.

(56) References Cited

U.S. PATENT DOCUMENTS

| 6,198,136 | B1 | 3/2001 | Voldman et al. |
| 7,005,747 | B2* | 2/2006 | Koizumi ................. 257/777 |
| 2004/0183209 | A1* | 9/2004 | Lin ....................... 257/778 |
| 2005/0146838 | A1 | 7/2005 | Shioga et al. |
| 2007/0111462 | A1 | 5/2007 | Lee et al. |
| 2007/0145527 | A1 | 6/2007 | Yamabi et al. |

FOREIGN PATENT DOCUMENTS

| JP | 2000307403 A | 11/2000 |
| JP | 2002016222 A | 1/2002 |

* cited by examiner

*Primary Examiner* — Benjamin P Sandvik
*Assistant Examiner* — Krista Soderholm
(74) *Attorney, Agent, or Firm* — Yingsheng Tung; Wade J. Brady, III; Frederick J. Telecky, Jr.

(57) ABSTRACT

One aspect of the invention provides a semiconductor device that includes a microchip having an outermost surface. First and second bond pads are located on the microchip and near the outermost surface. A first UBM contact is located on the outermost surface and between the first and second bond pads. The first UBM contact is offset from the first bond pad. A second UBM contact is located on the outermost surface and between the first and second bond pads. The second UBM contact is offset from the second bond pad, and a capacitor supported by the microchip is located between the first and second UBM contacts.

18 Claims, 5 Drawing Sheets

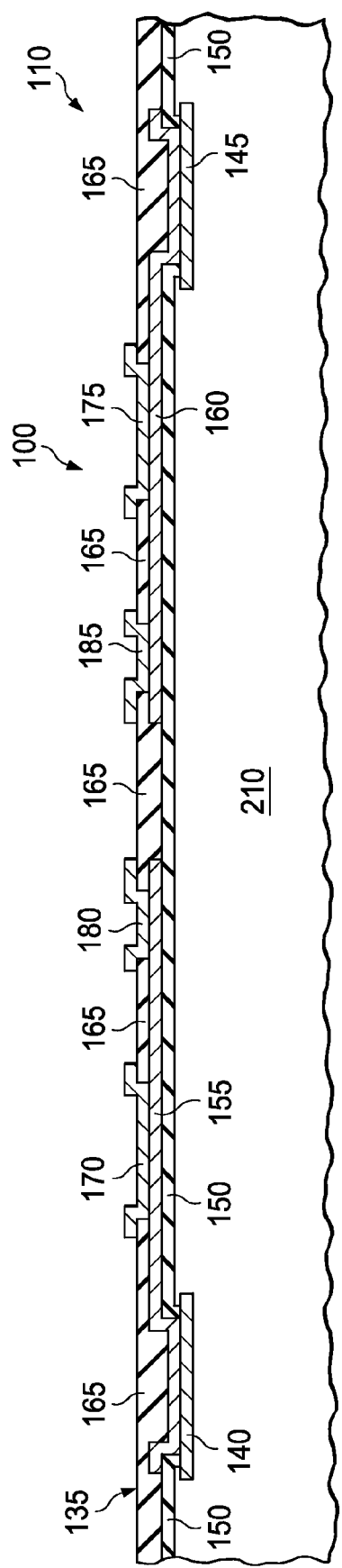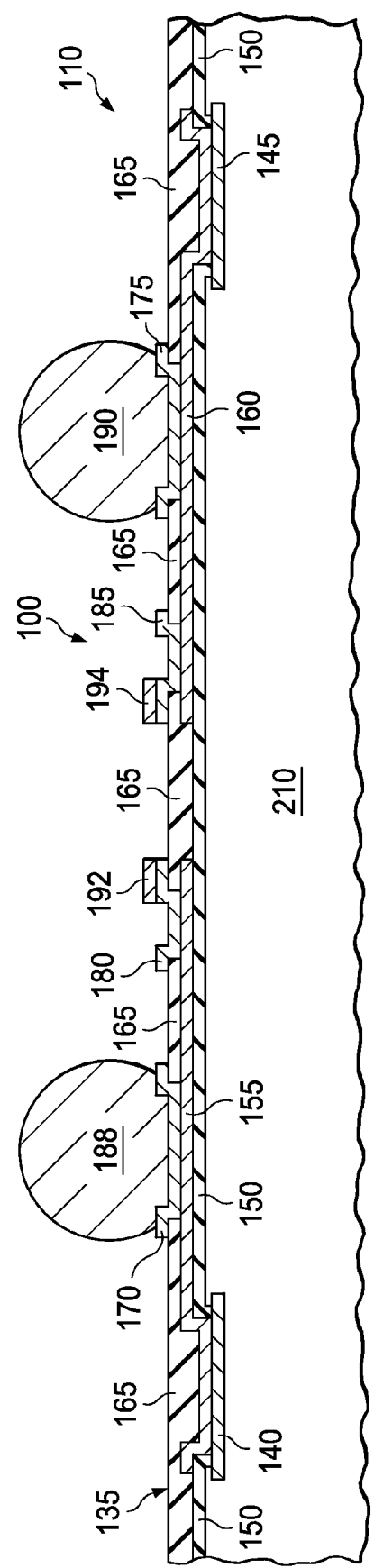

SEMICONDUCTOR DEVICE HAVING WAFER LEVEL CHIP SCALE PACKAGING SUBSTRATE DECOUPLING

CROSS-REFERENCE TO PROVISIONAL APPLICATION

This application claims the benefit of U.S. Provisional Application Ser. No. 60/968,098, entitled "WCSP On-Package Substrate SM Decoupling" filed on Aug. 27, 2007 by Rajen M. Murugan, et al., commonly assigned with the invention and incorporated herein by reference.

TECHNICAL FIELD

The disclosure is directed to a semiconductor device having wafer level chip scale packaging (WCSP) substrate decoupling for the mid-frequency range.

BACKGROUND

As semiconductor devices have gotten ever smaller, competing performance requirements of these devices forces semiconductor manufactures to be conflicted. On the one hand, the market demands that the semiconductor devices, such as those used in mobile communications, have increasingly faster operating speeds. On the other, however, that same market demands that these faster operating speeds be achieved with reduced power consumption. These competing design requirements have forced the industry to try to strike a balance between faster operating speeds and reduced power consumption.

In many high performance electronics devices, the printed circuit board (PCB) typically has a microchip tied into a memory chip, and when the input/output (I/O) of the memory is required to switch faster, it requires more current from the power distribution network. The faster the device switches the more current it pulls from the power distribution network, which results in noise. Moreover, increase in noise has also arisen due to layer reductions made in the package in which the microchip is encased, thereby causing routing congestion in the package. Routing congestion can cause cross-talk issues due to capacitance and inductance coupling, which adds to the noise issues within the system. Because crosstalk can generate significant unwanted noise in nearby lines, causing problems of skew, delay, logic faults, and radiated emission, the crosstalk phenomena is drawing more attention than. If this noise remains unmanaged, it can affect the I/O and functionality of the device. For example, noise can cause the devices to lose data, produce high electromagnetic interference, blow transistors, or cause complete device failure. Manufactures have managed to lower current noise level at the PCB and the high current noise within the microchip.

SUMMARY

In one embodiment, there is provided a semiconductor device that comprises a microchip that has an outermost surface. First and second bond pads are located on the microchip and near the outermost surface. A first distribution line is located over and contacts the first bond pad, and a second distribution line is located over and contacts the second bond pad. A first under bump metal (UBM) contact is located between the first and second bond pads. The first UBM is laterally offset from the first bond pad, is located over and contacts the first distribution line, and has a first solder bump located thereon. A second UBM contact is located between the first and second bond pads and is laterally offset from the second bond pad. It is located over and contacts the second distribution line and has a second solder bump located thereon. A first capacitor contact is located between the first and second solder bumps. It is located over and contacts the first distribution line and has solder located thereon. A second capacitor contact is located between the first and second solder bumps. It is located over and contacts the second distribution line and has solder located thereon. A first end of a capacitor contacts the solder located on the first capacitor contact and a second end of the capacitor contacts the solder located on the second capacitor contact.

Another embodiment provides a semiconductor device that includes a microchip having an outermost surface. First and second bond pads are located on the microchip and near the outermost surface. The first under bump metal (UBM) contact is located on the outermost surface of the microchip and between the first and second bond pads. The first UBM contact is offset from the first bond pad. A second UBM contact is located on the outermost surface of the microchip and between the first and second bond pads. The second UBM contact is offset from the second bond pad, and a capacitor supported by the microchip is located between the first and second UBM contacts.

In another embodiment, there is provided a method of manufacturing a semiconductor device. This embodiment includes providing a microchip having a first passivation layer located thereover. The microchip includes first and second bond pads located on the microchip near an outermost surface thereof, a first distribution line located over and contacting the first bond pad, a second distribution line located over and contacting the second bond pad, a first under bump metal (UBM) contact located between the first and second bond pads and laterally offset from the first bond pad and located over and contacting the first distribution line, a second UBM contact located between the first and second bond pads and laterally offset from the second bond pad and located over and contacting the second distribution line, a first capacitor contact located between the first and second UBM contacts and located over and contacting the first distribution line, a second capacitor contact located between the first capacitor contact and the second distribution line and located over and contacting the second distribution line, and a second passivation layer located over the first and second distribution lines. The method further includes forming a first solder bump on the first UBM, forming a second solder bump on the second UBM contact, placing a first end of a capacitor over the first capacitor contact and placing a second end of the capacitor over the second capacitor contact, and bringing the first and second solder bumps located on the first and second UBM contacts into contact with first and second bond pads located on a printed circuit board.

In another embodiment, there is provided a method of manufacturing a semiconductor device that includes providing a microchip having first and second under bump metal (UBM) contacts located on an outer most surface of the microchip and located between first and second bond pads and having first and second capacitor contacts located between the first and second UBM contacts, placing solder on the first and second UBM contacts and the first and second capacitor contacts, placing first and second ends of a capacitor on the solder located on the first and second capacitor contacts, and bringing the solder located on the first and second UBM contacts into contact with first and second bond pads located on a printed circuit board.

BRIEF DESCRIPTION OF DRAWINGS

The disclosure is described with reference to example embodiments and to accompanying drawings, wherein:

FIGS. 2-8 illustrate different stages of the fabrication of a microchip manufactured by certain embodiments of the invention.

DETAILED DESCRIPTION

Figure 1:
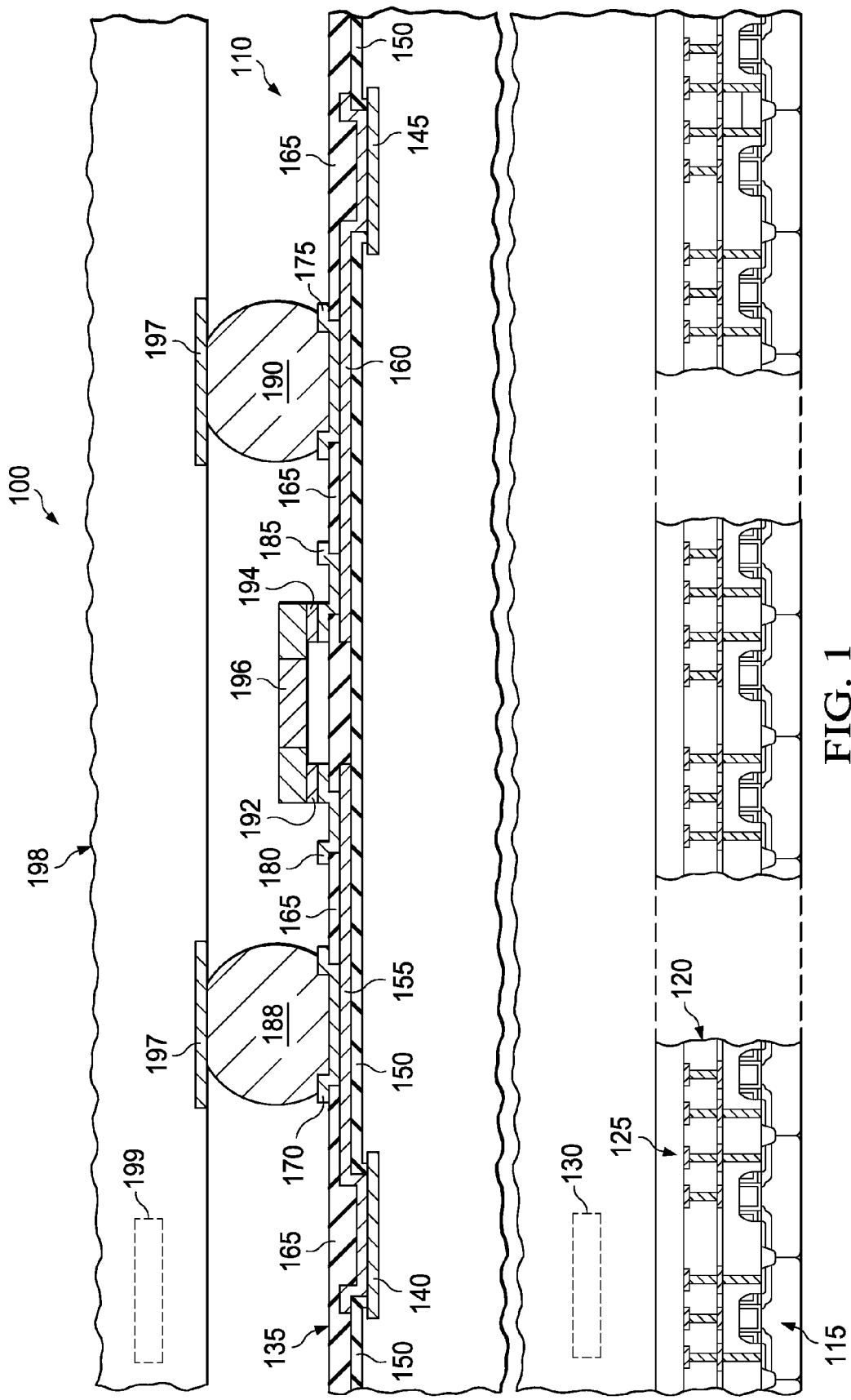
FIG. 1 illustrates a semiconductor device that can be made using the principles of the invention.

FIG. 1 illustrates one embodiment of a semiconductor device 100 that can be made in accordance with the invention. In this embodiment, the device 100 includes a microchip 110. As used herein, a microchip 110, which may also be referred to as a die, is a miniaturized electronic circuit that includes transistors 115, with overlying dielectric layers 120 that have interconnects 125, including metal lines and vias or contact plugs formed therein. The transistors 115 may be of conventional design and include structures, such as gate electrodes, wells and source/drains. Though not shown, the semiconductor device 100 may further include memory blocks with which the microchip is associated. They may be incorporated into the microchip 110 or be electrically connected to a separate microchip. In certain embodiments, the microchip 110 may also include a high frequency filter 130, such as a capacitor, which is schematically shown by the dashed box. In one embodiment, the filter 130 may be incorporated directly into the microchip 110 in a conventional manner. The filter 130 may be configured to filter frequencies greater than 2 GHz.

The microchip 110 has an outermost surface 135, which is the surface over which one or more outer passivation layers may be located. The outermost surface 135 includes bond pads 140, 145 located within the outermost surface 135 that may be of conventional design. The illustrated embodiment further includes a passivation layer 150 that is located over the outermost surface 135. A distribution line 155, which may be a power, ground or signal line, extends from the bond pad 140 and partially across the microchip 110. Another distribution line 160 extends from the bond pad 145 and partially across the microchip 110 as shown. These distribution lines 155, 160 may be of conventional design and form separate circuits within the microchip 110.

Another passivation layer 165 that is located over the distribution lines 155, 160 may also be included in one embodiment as shown. Located over the distribution lines 155, 160 are under bump metal UBM contacts 170, 175 and capacitor contacts 180, 185. Solder bumps 188, 190 located on the UBM contacts 170, 175 and solder pads 192, 194 located on the capacitor contacts 180, 185 may also be included in one embodiment, as illustrated.

FIG. 1 also illustrates a capacitor 196 that is located on the solder pads 192, 194 and bridges the distribution lines 155, 160. The solder bumps 188, 190 may be positioned to contact bond pads 197 of a printed circuit board (PCB) 198. The PCB 198 may also include an associated low frequency filter 199, schematically shown by the dashed box and that is configured to remove low frequencies of less than 200 MHz. The capacitor 196 filters out noise that occurs within the distribution layers that is not removed by filters 130, 199.

Figure 2:
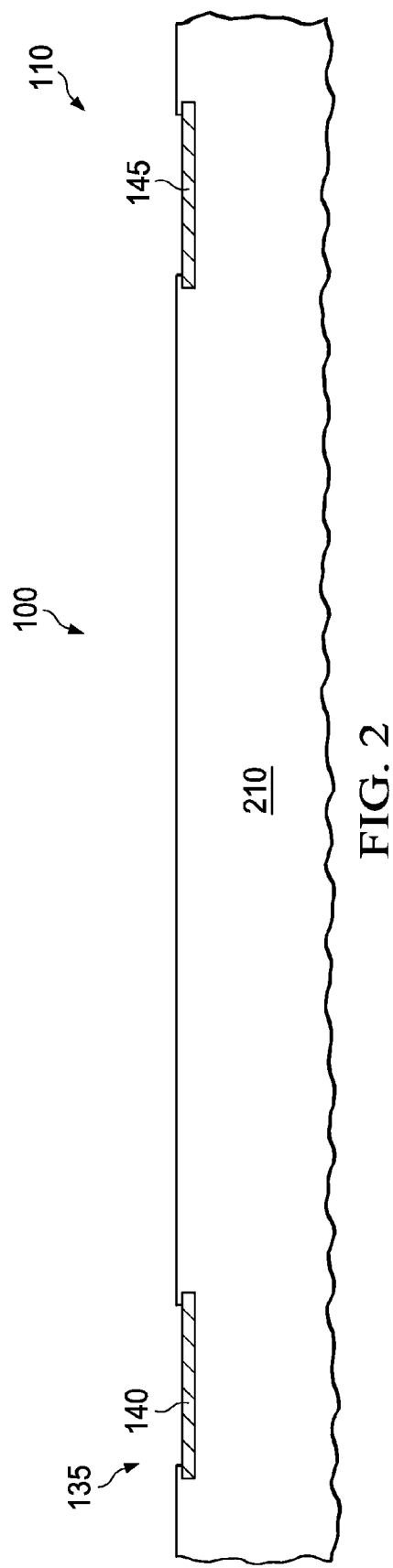

FIG. 2 illustrates an embodiment of the device 100 of FIG. 1 at an earlier stage of fabrication and shows only a layer 210 and the outermost surface 135 of the microchip 110, as mentioned above. Layer 210 may comprise a conventional dielectric material used in the manufacture of semiconductor devices. The layer 210 contains at least a portion of a distribution network within the microchip 110. Noise within the medium frequency range (200 MHz to 2 GHz) may occur within the distribution network of the microchip 110 due to increased distribution line density.

In the past, frequencies in the medium range have not been a problem because the packaging portion of the microchip 110 was a passive environment. However, package materials are now showing transmission line effects within the package that can disrupt the operational quality of the microchip 110, with inductance being one of them. This problem has arisen because of distribution line (e.g., power and signal lines) density within the package has increased due to the reduction of the numbers of layers in which those distribution lines are formed. The increased density of the distribution lines within the package increase capacitance and inductance coupling within the microchip 110, which results in cross talk or noise.

Present systems are ineffective in that system-level power distribution network decoupling is poor, which leads to system failure and functional issues. For example, large excessive current transient riding on the power distribution network leads to electromagnetic emission at the package/integrated circuit (IC) interface. Further, high-level coupling of noise from the power distribution network to the fast switching I/O leads to signal integrity problems, and at present, there is ineffective PCB-based decoupling capacitance in the mid-frequency ranges stated above.

The microchip 110 at this stage also includes the bond pads 140, 145, mentioned above. The bond pads may also be of conventional design and may comprise conductive materials, such as aluminum, copper, or a combination thereof. Though the bond pads 140, 145 are shown formed within the layer 210, it should be understood that in other embodiments, the bond pads 140, 145 may also be formed on top of layer 210. The microchip 110 of FIG. 2 may be provided by obtaining it from an external or internal source of the manufacturer.

Figure 3:
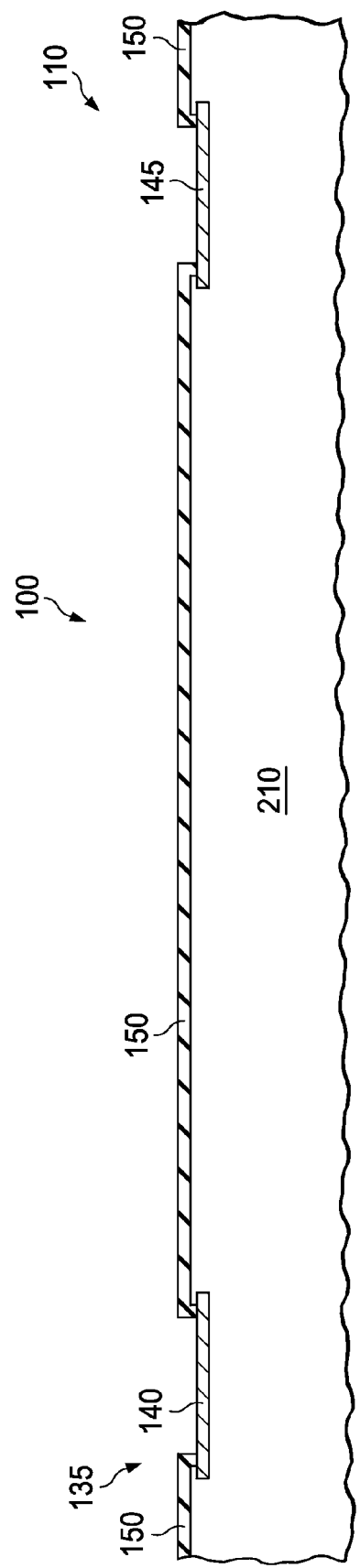

FIG. 3 illustrates an embodiment of the microchip 110 of FIG. 2 after the formation of the passivation layer 150 over the microchip 110. The passivation layer 150 may be comprised of conventional materials and conventional deposition processes may be used to form the passivation layer 150. For example, the passivation layer 150 may be comprised of an organic resin. In one embodiment, the passivation layer 150 is deposited as a continuous layer across the surface 135 and on the bond pads 140, 145 and is patterned to expose at least a portion of the bond pads 140, 145, as generally shown. Though the illustrated embodiment shows the passivation layer 150 located directly on the surface 135 and the bond pads, 140, 145, it should be understood that in other embodiments, an intervening layer may be located between the surface 135 and the bond pads 140, 145. The passivation layer 150 helps to encapsulate the microchip 110 and protect it from environmental conditions and contamination. The microchip 110 of FIG. 3 may be provided by obtaining the device of FIG. 3 from an external or internal source of the manufacturer.

Figure 4:
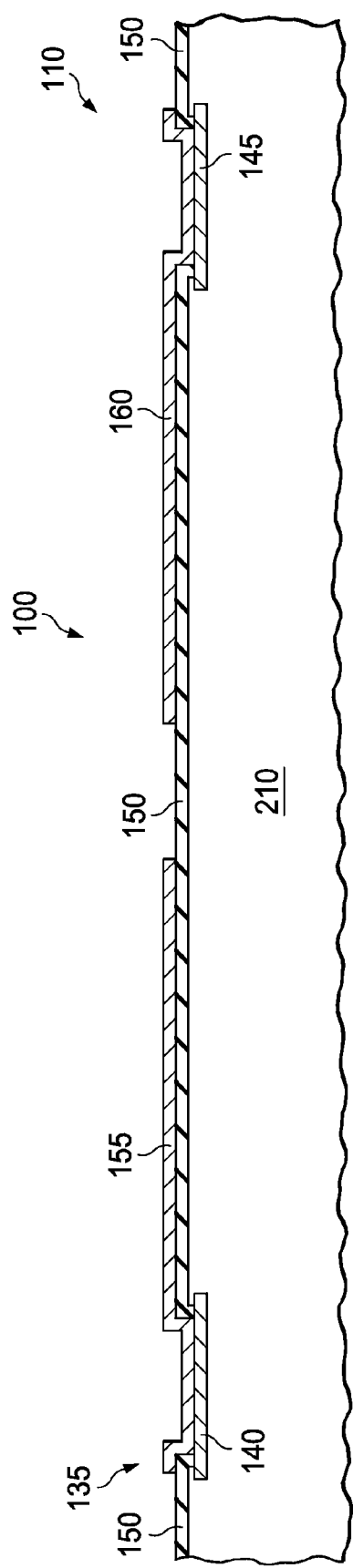

FIG. 4 illustrates an embodiment of the microchip 110 of FIG. 3 after the formation of distribution lines 155, 160. The distribution lines 155, 160 may be comprised of conventional materials and conventional deposition processes may be used to form them. For example, the distribution lines 155, 160, may be comprised of copper, aluminum or a combination of these or other conductive materials, and they may be deposited using chemical vapor deposition, atomic layer deposition, or physical vapor deposition processes. In one embodiment, the distribution lines 155, 160 are formed by depositing a continuous layer across the microchip 110 and patterning it to form separate distribution lines 155, 160, as generally shown. However, unlike the passivation layer 150, the distribution lines 155, 160 are patterned to be in contact with the bond pads 140, 145. Though the illustrated embodiment shows the distribution lines 155, 160 located directly on the passivation layer 150, it should be understood that in other embodiments, an intervening layer may be located between the passivation layer 150 and the distribution lines 155, 160. One or more additional conductive layers may also be located between the bond pads 140, 145 and the distribution lines 155, 160 such that they are in electrical contact with the bond pads 140, 145. As seen in the illustrated embodiment, the distribution lines are separated and not in direct electrical contact with each other. As such, they form two separate electrical circuits with bond pad 140 and 145, respectively. As with prior stages, the microchip 110 of FIG. 4 may be provided by obtaining it from an external or internal source of the manufacturer.

Figure 5:
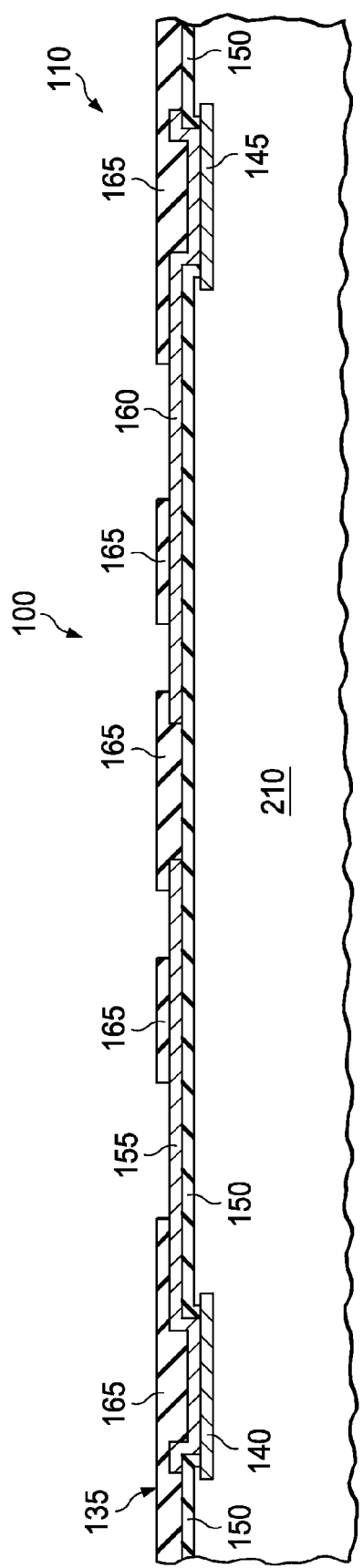

FIG. 5 illustrates an embodiment of the microchip 110 of FIG. 4 after the formation of another passivation layer 165. The passivation layer 165 may be comprised of conventional materials, such as an organic region, and conventional deposition processes may be used to form them. In one embodiment, the passivation layer 165 is formed by depositing a continuous layer across the microchip 110 and is patterned to expose portions of the distribution lines 155, 160 as generally shown. Though the illustrated embodiment shows the passivation located directly on underlying layers, it should be understood that in other embodiments, an intervening layer may be located between those underlying layers and the passivation layer 165. As with prior stages, the microchip 110 of FIG. 5 may be provided by obtaining it from an external or internal source of the manufacturer.

FIG. 6 illustrates an embodiment of the microchip 110 of FIG. 5 after the formation of under bump metal (UBM) contacts 170 and 175 and capacitor contacts 180, 185. In one embodiment, these contacts may be comprised of the same type of conductive material, such as copper, aluminum, or combinations thereof. Additionally, conventional deposition processes may be used to form them. For example, these contacts may be deposited using chemical vapor deposition, atomic layer deposition, or physical vapor deposition processes. In one embodiment, these contacts are formed by depositing a continuous conductive layer across the microchip 110 and patterning it to form the contacts, 170, 175, 180, and 185, as generally shown.

The metal used to form these contacts is also deposited within the openings of the passivation layer 165, and thus, are in respective electrical contact with the bond pads 140, 145. For example, UBM contact 170 and capacitor contact 180 are in electrical contact with distribution line 155 and bond pad 140, whereas UBM contact 175 and capacitor contact 185 are in electrical contact with distribution line 160 and bond pad 145; thereby, forming separate electrical circuits. Though the illustrated embodiment shows contacts 170, 175, 180 and 185 located directly on distribution lines 155, 160, it should be understood that in other embodiments, an intervening conductive layer might be located between distribution lines 155, 160 and contacts 170, 180 and 175, 185, respectively. As with prior stages, the microchip 110 of FIG. 6 may be provided by obtaining it from an external or internal source of the manufacturer.

FIG. 7 illustrates an embodiment of the microchip 110 of FIG. 6 after the formation of UBM solder bumps 188 and 190 and capacitor contact solder bumps 192, 194 on the UBM contacts 170 and 175 and capacitor contacts 180, 185, respectively. Bumps 188, 190 and 192, 194 may be applied at the same time or in separate steps, and thus, may be applied by separate manufacturers. The solder may comprise a conventional material and be applied using conventional processes. Since the solder is formed on UBM contacts 170, 175 and capacitor contacts 180, 185, they are in respective electrical connection with distribution lines 155, 160 and bond pads 140, 145. As with prior stages, the microchip 110 of FIG. 7 may be provided by obtaining it from an external or internal source of the manufacturer.

Figure 8:
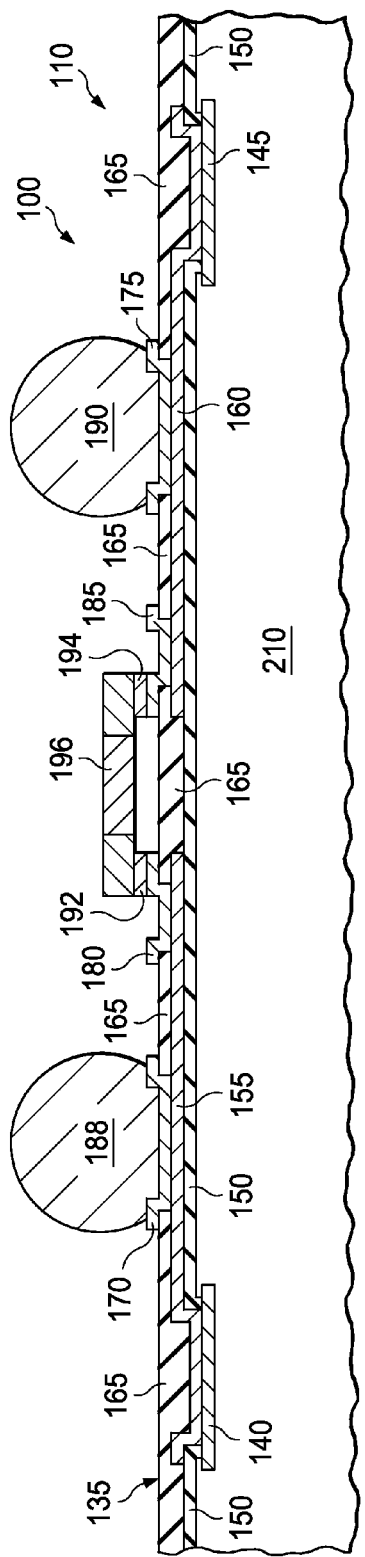

FIG. 8 illustrates the device 110 of FIG. 7 after the placement of the capacitor 196 on the capacitor contacts 192, 194. The capacitor is positioned on the contacts 192, 194 and is followed by a re-flow process that permanently connects the capacitor 196 to the contacts 192, 194. The capacitor 196 is designed to filter out medium frequencies ranging from about 200 MHz to about 2000 GHz. The capacitor 196 electrically connects the bond pad 140, the distribution line 150, and the solder bump 188 to the bond pad 145, the distribution line 160, and the solder bump 190. Given this configuration, the capacitor 196 serves as a filter to remove noise within the medium frequency range as stated above, thereby decoupling capacitance and inductance within the device and removing cross-talk and improving the performance of the microchip 110. As with prior stages, the microchip 110 of FIG. 8 may be provided by obtaining it from an external or internal source of the manufacturer.

Once the fabrication of the microchip of FIG. 8 is completed, it is brought into contact with the bond pads 197 of the PCB 198, as shown in FIG. 1 and permanent connection is achieved by re-flowing the solder bumps 197.

Figure 9:
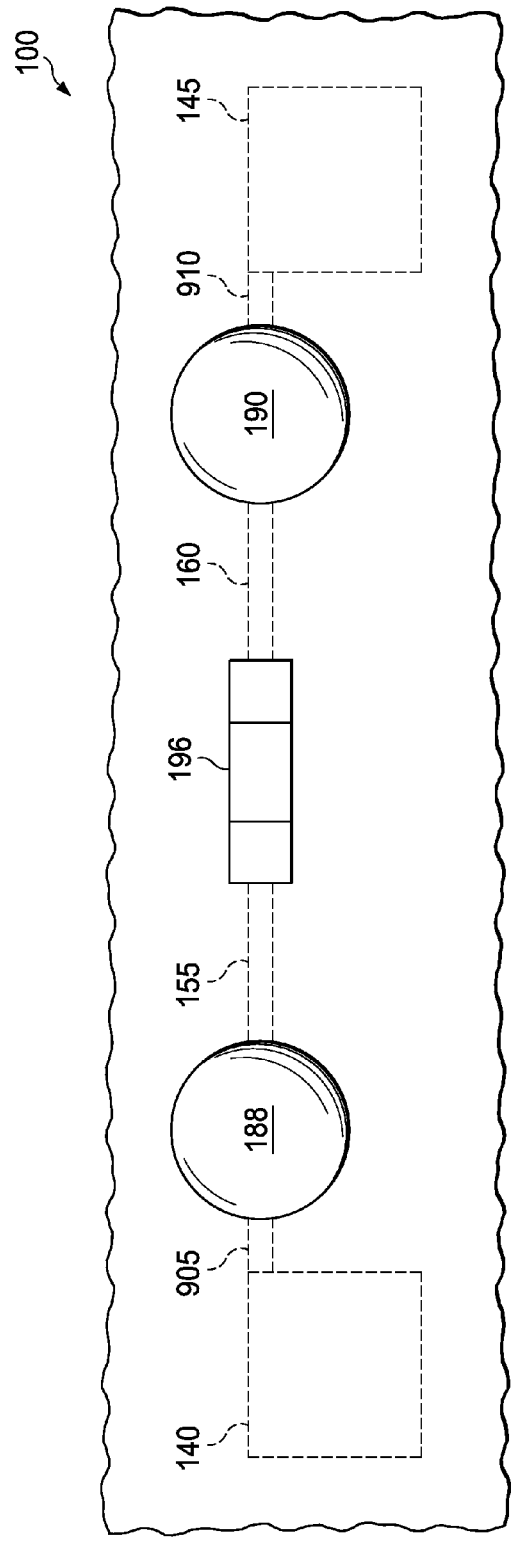
FIG. 9 illustrates a partial overhead view of the microchip.

FIG. 9 shows a schematic overhead view of a portion of the semiconductor device 100. As seen, the solder bumps 188, 190, and the capacitor 196 are connected to bond pads 140, 145 by distribution lines 155, 160 and metal lines 905, 910.

Thus, the embodiments set forth herein, provide effective capacitors that provide decoupling within the mid-frequency range at the bottom of the wafer level CSP (WCSP), more specifically in the clearance area between the solder balls, which has not been utilized previously. The reduction in leads length reduces the associated parasitics of the capacitance, in particular the effective series inductance. Moreover, the close proximity of the capacitors to the I/O provides the additional charge supply for the I/O during fast switching activity with associated memory.

Some advantages associated with the embodiments set forth herein include must lower cost than embedded passives with easily assembly. Further, it can be implemented on all WCSP designs where other solutions require capacitors located on the PCB to solve system-level problems. Additionally, because the capacitor is located on the bottom of the WCSP substrate, the mechanical and real-estate limitations associated with other solutions in not present.

Those skilled in the art to which the disclosure relates will appreciate that other and further additions, deletions, substitutions, and modifications may be made to the described example embodiments, without departing from the disclosure.

What is claimed is:
1. A semiconductor device, comprising:
   a microchip having an outermost surface;
      first and second bond pads located on the microchip and near the outermost surface;
      a first distribution line located over and contacting the first bond pad;
      a second distribution line located over and contacting the second bond pad;
      a first under bump metal (UBM) contact located between the first and second bond pads and laterally offset from the first bond pad and located over and contacting the first distribution line and having a first solder bump located thereon;

a second UBM contact located between the first and second bond pads and laterally offset from the second bond pad and located over and contacting the second distribution line and having a second solder bump located thereon;

a first capacitor contact located between the first and second solder bumps and located over and contacting the first distribution line and having solder located thereon;

a second capacitor contact located between the first and second solder bumps located over and contacting the second distribution line and having solder located thereon; and a capacitor configured to filter frequencies ranging from about 200 MHz to about 2 GHz, having a first end that contacts the solder located on the first capacitor contact and a second end that contacts the solder located on the second capacitor contact.

2. The device of claim 1, wherein the first distribution line, the first bond pad, the first UBM contact, and the first capacitor contact form a first circuit, and the second distribution line, the second bond pad, the second UBM contact, and the second capacitor contact form a second circuit, and wherein the first and second circuits are connected by the capacitor.

3. The device of claim 1, further including a printed circuit board (PCB) having first and second contact pads, wherein the first and second solder bumps contact the first and second contact pads of the PCB and the capacitor is located between the outer surface of the microchip and the PCB.

4. The device of claim 3, wherein the PCB includes a filter that filters frequencies below 200 MHz and the microchip includes a filter that filters frequencies greater than 2 GHz.

5. A semiconductor device, comprising:
a microchip having an outermost surface;
first and second bond pads located on the microchip and near the outermost surface;
a first under bump metal (UBM) contact located on the outermost surface of the microchip and between the first and second bond pads, the first UBM contact being offset from the first bond pad;
a second UBM contact located on the outermost surface of the microchip and between the first and second bond pads, the second UBM contact being offset from the second bond pad; and
a capacitor configured to filter frequencies ranging from about 200 MHz to about 2 GHz, supported by the microchip and located between the first and second UBM contacts.

6. The device of claim 5, further including first and second distribution lines and first and second capacitor contacts, wherein the first UBM contact and the first capacitor contact are connected by the first distribution line and the second UBM contact and the second capacitor contact are connected by the second distribution line, and wherein the capacitor is connected to the first and second capacitor contacts.

7. The device of claim 6, wherein a first solder bump contacts the first UBM contact and a second solder bump contacts the second UBM contact and solder is located on the first and second capacitor contacts.

8. The device of claim 7, further including a printed circuit board (PCB) having first and second contact pads, wherein the first and second solder bumps contact the first and second contact pads and the capacitor is located between the outer surface of the microchip and the PCB.

9. A method of manufacturing a semiconductor device, comprising:
providing a microchip having a first passivation layer located thereover, the microchip including:
first and second bond pads located on the microchip near an outermost surface thereof;
a first distribution line located over and contacting the first bond pad;
a second distribution line located over and contacting the second bond pad;
a first under bump metal (UBM) contact located between the first and second bond pads and laterally offset from the first bond pad and located over and contacting the first distribution line;
a second UBM contact located between the first and second bond pads and laterally offset from the second bond pad and located over and contacting the second distribution line;
a first capacitor contact located between the first and second UBM contacts and located over and contacting the first distribution line;
a second capacitor contact located between the first capacitor contact and the second distribution line and located over and contacting the second distribution line; and
a second passivation layer located over the first and second distribution lines;
forming a first solder bump on the first UBM;
forming a second solder bump on the second UBM contact;
placing a first end of a capacitor over the first capacitor contact and placing a second end of the capacitor over the second capacitor contact; and
bringing the first and second solder bumps located on the first and second UBM contacts into contact with first and second bond pads located on a printed circuit board.

10. The method of claim 9, wherein providing includes forming the first and second distribution lines, the second passivation layer, the first and second UBM contacts, and the first and second capacitor contacts.

11. The method of claim 9, wherein the capacitor is configured to filter frequencies ranging from about 200 MHz to about 2 GHz.

12. The method of claim 9, further including forming solder bumps on the first and second capacitor contacts, and wherein placing the capacitor includes placing the first and second ends on the solder bumps located on the first and second capacitor contacts, respectively.

13. The method of claim 9, wherein the first distribution line, the first bond pad, the first UBM contact, and the first capacitor contact form a first circuit, and the second distribution line, the second bond pad, the second UBM contact, and the second capacitor contact form a second circuit, and wherein the first and second circuits are connected by the capacitor.

14. A method of manufacturing a semiconductor device, comprising:
providing a microchip having first and second under bump metal (UBM) contacts located on an outer most surface of the microchip and located between first and second bond pads and having first and second capacitor contacts located between the first and second UBM contacts;
placing solder on the first and second UBM contacts and the first and second capacitor contacts;
placing first and second ends of a capacitor on the solder located on the first and second capacitor contacts; and bringing the solder located on the first and second UBM contacts into contact with first and second bond pads located on a printed circuit board.

15. The method of claim 14, wherein providing includes:
forming first and second distribution lines respectively located over and contacting the first and second bond pads;
forming the first and second UBM contacts in respective contact with the first and second distribution lines; and
forming the first and second capacitor contacts in respective contact with the first and second distribution lines.

16. The method of claim 15, wherein the first distribution line, the first bond pad, the first UBM contact, and the first capacitor contact form a first circuit, and the second distribution line, the second bond pad, the second UBM contact, and the second capacitor contact form a second circuit, and wherein the first and second circuits are connected by the capacitor.

17. The method of claim 15, wherein the microchip includes a first passivation layer and the method further includes forming a second passivation layer over the first and second distribution lines prior to forming the first and second UBM contacts and the first and second capacitor contacts.

18. The method of claim 17 further including bringing the solder located on the first and second UBM contacts into contact with first and second bond pads located on a printed circuit board.

* * * * *